United States Patent
Ren et al.

(10) Patent No.: US 12,224,081 B2
(45) Date of Patent: Feb. 11, 2025

(54) CONDUCTIVE PASTE AND ELECTRONIC DEVICE

(71) Applicant: Beijing Dream Ink Technologies Co., Ltd., Beijing (CN)

(72) Inventors: Zhongwei Ren, Beijing (CN); Jiameng Kang, Beijing (CN)

(73) Assignee: Beijing Dream Ink Technologies Co., Ltd., Beijing (CN)

( * ) Notice: Subject to any disclaimer, the term of this patent is extended or adjusted under 35 U.S.C. 154(b) by 309 days.

(21) Appl. No.: 17/790,468

(22) PCT Filed: Nov. 23, 2021

(86) PCT No.: PCT/CN2021/132383
§ 371 (c)(1),
(2) Date: Jun. 30, 2022

(87) PCT Pub. No.: WO2022/183783
PCT Pub. Date: Sep. 9, 2022

(65) Prior Publication Data
US 2023/0170108 A1 Jun. 1, 2023

(30) Foreign Application Priority Data
Mar. 4, 2021 (CN) .......................... 202110240550.0

(51) Int. Cl.
*H01B 1/22* (2006.01)
*C08K 3/08* (2006.01)
(Continued)

(52) U.S. Cl.
CPC ................. *H01B 1/22* (2013.01); *C08K 3/08* (2013.01); *C08L 63/00* (2013.01); *C08L 75/08* (2013.01);
(Continued)

(58) Field of Classification Search
CPC ... C08K 3/08; C08K 2003/0806; C08L 63/00; C08L 75/08; H05K 1/092; H05K 3/1283; H05K 3/34; H05K 2201/032
See application file for complete search history.

(56) References Cited

U.S. PATENT DOCUMENTS

| 2016/0318134 A1 | 11/2016 | de Avila Ribas et al. |
| 2017/0240687 A1* | 8/2017 | Frick ................... C08G 18/4233 |
| 2018/0237669 A1* | 8/2018 | Qin .......................... C08L 63/00 |

FOREIGN PATENT DOCUMENTS

| CN | 101544742 A | 9/2009 |
| CN | 106318114 A | 1/2017 |

(Continued)

OTHER PUBLICATIONS

CN Office Action dated (unknown) issued in CN Application No. 202110240550.0.

(Continued)

*Primary Examiner* — Nathan Milakovich
(74) *Attorney, Agent, or Firm* — Weaver Austin Villeneuve & Sampson LLP

(57) ABSTRACT

The present application provides a conductive paste and an electronic device, and relates to the technical field of function materials. The conductive paste according to the present application includes: a base resin, a solvent, a conductive filler, a curing agent, and an auxiliary agent. The base resin is a mixture of epoxy resin and polyurethane, a weight percentage of the epoxy resin in the base resin is greater than or equal to 50%, and the epoxy resin limits the polyurethane in a structure formed by curing of the base resin. According to the technical solution of the present application, soldering can be performed directly by solder paste, and good flexibility is brought.

8 Claims, 2 Drawing Sheets

(51) Int. Cl.
*C08L 63/00* (2006.01)
*C08L 75/08* (2006.01)
*H05K 1/09* (2006.01)
*H05K 3/12* (2006.01)
*H05K 3/34* (2006.01)

(52) U.S. Cl.
CPC .......... *H05K 1/092* (2013.01); *H05K 3/1283* (2013.01); *H05K 3/34* (2013.01); *C08K 2003/0806* (2013.01); *H05K 2201/032* (2013.01)

(56) References Cited

FOREIGN PATENT DOCUMENTS

| | | | |
|---|---|---|---|
| CN | 108447587 A | 8/2018 | |
| CN | 110168015 A | 8/2019 | |
| CN | 110272677 A | 9/2019 | |
| CN | 111243778 A * | 6/2020 | ............... H01B 1/22 |
| CN | 111370159 A | 7/2020 | |
| CN | 112927837 A | 6/2021 | |
| JP | H03291807 A | 12/1991 | |
| JP | 2014011199 A | 1/2014 | |
| WO | WO-2014010524 A1 * | 1/2014 | ......... C08G 18/0823 |

OTHER PUBLICATIONS

CN ISR dated (unknown) issued in CN Application No. PCT/CN2021/132383 [English translation not available].
CN Written Opinion dated Mar. 1, 2022 in Application No. PCT/CN2021/132383, with English Translation.

\* cited by examiner

1

CONDUCTIVE PASTE AND ELECTRONIC DEVICE

The present application is a National Stage Application, filed under 35 U.S.C. 371, of International Patent Application No. PCT/CN2021/132383, filed on Nov. 23, 2021, which claims priority to Chinese patent application No. 2021102405500, entitled "CONDUCTIVE PASTE AND ELECTRONIC DEVICE", filed on Mar. 4, 2021, the contents of both of which are incorporated herein by reference in their entirety.

TECHNICAL FIELD

The present application relates to the technical field of function materials, and in particular, to a conductive paste and an electronic device.

BACKGROUND

A copper layer on top of a conventional printed circuit board is easily oxidized to inhibit a wetting effect of solder paste. This phenomenon makes the copper layer unable to produce reliable solder joints, increasing a risk of fall-off of assembly of electronic components. The copper layer is easily oxidized, and soldering reliability can be improved by electroplating or electroless plating of a nickel or gold layer. However, the process is complicated and causes environmental pollution.

In the related art, there are also technical solutions to make a printed circuit board by using a low-temperature curing conductive paste instead of copper. However, the existing low-temperature curing conductive paste cannot be soldered directly by solder paste. Therefore, it is desirable to develop a conductive paste that can be soldered directly by solder paste.

SUMMARY

The present application provides a conductive paste and an electronic device, which can be soldered directly by solder paste and bring good flexibility.

In a first aspect, the present application provides a conductive paste, and adopts the following technical solution.

The conductive paste includes: a base resin, a solvent, a conductive filler, a curing agent, and an auxiliary agent, wherein the base resin is a mixture of epoxy resin and polyurethane, a weight percentage of the epoxy resin in the base resin is greater than or equal to 50%, and the epoxy resin limits the polyurethane in a structure formed by curing of the base resin.

Optionally, the conductive paste further includes a low-molecular weight polyol, the curing agent is blocked polyisocyanate, and the polyurethane, the low-molecular weight polyol, and the blocked polyisocyanate react during heat curing to form a flexible three-dimensional net structure.

Optionally, the epoxy resin has a softening point above 100° C., an epoxide equivalent higher than 5000 g/eq, and a molecular weight higher than 10000 g/mol.

Optionally, the polyurethane has an elongation rate higher than 200% and a Kofler melting point above 70° C.

Optionally, the conductive filler is ball silver powder with a particle size in a range from 400 nm to 600 nm.

Optionally, the low-molecular weight polyol is one or two of polyethylene glycol and polypropylene glycol.

Optionally, the blocked polyisocyanate is one or a mixture of at least two of blocked toluene diisocyanate, blocked hexamethylene diisocyanate, blocked diphenylmethane diisocyanate, blocked isophorone diisocyanate, blocked xylylene diisocyanate, and blocked polyphenylmethane polyisocyanate.

Optionally, the conductive paste includes: 3 wt % to 15 wt % of the base resin, 5 wt % to 20 wt % of the solvent, 60 wt % to 85 wt % of the conductive filler, 3 wt % to 15 wt % of the low-molecular weight polyol, 3 wt % to 10 wt % of the blocked polyisocyanate, and 0.2 wt % to 10 wt % of the auxiliary agent.

In a second aspect, the present application provides an electronic device, and adopts the following technical solution.

The electronic device includes a substrate and a conducting circuit located on the substrate, wherein the conducting circuit is formed by printing and heat curing of the conductive paste according to any one of the foregoing.

Optionally, the electronic device further includes an electronic component soldered to the conducting circuit by solder paste.

The present application provides a conductive paste and an electronic device. The base resin in the conductive paste is a mixture of epoxy resin and polyurethane, and a weight percentage of the epoxy resin in the base resin is greater than or equal to 50%, and the epoxy resin limits the polyurethane in a structure formed by curing of the base resin, so that a process of soldering the conducting circuit made of the conductive paste by solder paste has the following advantages. Firstly, epoxy resin has good acid and alkali resistance and corrosion resistance, and can withstand erosion or corrosion of flux components in the solder paste. Epoxy resin has good temperature resistance and can withstand a soldering temperature of the solder paste. Secondly, the conducting circuit has a good wetting effect on the solder paste, and after soldering, adhesion and stability between materials are good. Thirdly, the conducting circuit has a dense structure, and may not be subjected to tin immersion and falling off. Fourthly, the polyurethane in the cured base resin is restricted by the epoxy resin, and even if the polyurethane is softened to some extent, the soldering effect may not be affected. Fifthly, the polyurethane is flexible and cushions stress between a base material and the conductive paste during the soldering, increasing the flexibility of the conducting circuit.

BRIEF DESCRIPTION OF DRAWINGS

In order to more clearly illustrate the technical solutions in embodiments of the present application or the related art, the accompanying drawings used in the description of the embodiments or the related art will be briefly introduced below. It is apparent that, the accompanying drawings in the following description are only some embodiments of the present application, and other drawings can be obtained by those of ordinary skill in the art from the provided drawings without creative efforts.

DESCRIPTION OF EMBODIMENTS

Figure 1:
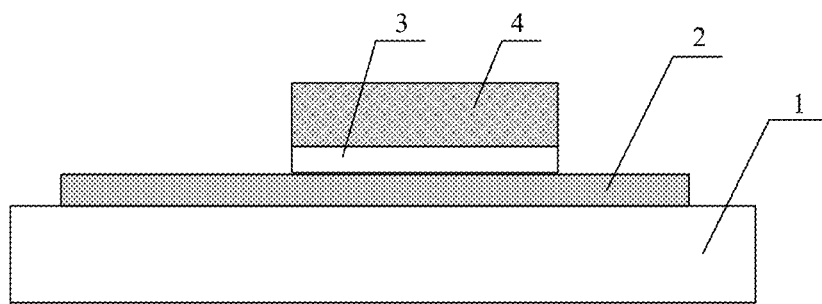
FIG. 1 is a schematic structural diagram of an electronic device according to an embodiment of the present application.

In order to make the objectives, technical solutions and advantages of the embodiments of the present application clearer, the technical solutions in the embodiments of the present invention will be described clearly and completely below with reference to the accompanying drawings in the embodiments of the present application. Apparently, the described embodiments are merely some of rather than all of the embodiments of the present application. All other embodiments acquired by those skilled in the art without creative efforts based on the embodiments of the present application shall fall within the protection scope of the present application It is to be noted that technical features in the embodiments of the present application may be combined with each other without conflict.

According to an embodiment of the present application, a conductive paste is provided. Specifically, the conductive paste includes: a base resin, a solvent, a conductive filler, a curing agent, and an auxiliary agent. The base resin is a mixture of epoxy resin and polyurethane, a weight percentage of the epoxy resin in the base resin is greater than or equal to 50%, and the epoxy resin limits the polyurethane in a structure formed by curing of the base resin.

The conductive paste according to the embodiment of the present application may be applied to screen printing, flexographic printing, pad printing, extrusion dispensing, steel screen printing, or other forming processes, and is formed and then heated to obtain a conducting circuit by curing.

A process of soldering the conducting circuit made of the conductive paste by solder paste has the following advantages. Firstly, epoxy resin has good acid and alkali resistance and corrosion resistance, and can withstand erosion or corrosion of flux components in the solder paste. Epoxy resin has good temperature resistance and can withstand a soldering temperature of the solder paste. Secondly, the conducting circuit has a good wetting effect on the solder paste, and after soldering, adhesion and stability between materials are good. Thirdly, the conducting circuit has a dense structure, and may not be subjected to tin immersion and falling off. Fourthly, the polyurethane in the cured base resin is restricted by the epoxy resin, and even if the polyurethane is softened to some extent, the soldering effect may not be affected. Fifthly, the polyurethane is flexible and cushions stress between a base material and the conductive paste during the soldering, increasing the flexibility of the conducting circuit.

Optionally, a conductive paste preparation method according to an embodiment of the present application may include the following steps.

In step S1, preparation of an organic carrier: epoxy resin, polyurethane, a solvent, and a curing agent are heated and dissolved to obtain the organic carrier.

In this process, the heating may be performed by oil bath, and stirring is performed at the same time. An oil bath temperature ranges optionally from 70° C. to 120° C., and a stirring speed ranges optionally from 300 rpm to 800 rpm.

In step S2, preparation of a conductive paste: a conductive filler and the organic carrier are stirred and dispersed, and then three-roll rolling is performed, to obtain the conductive paste.

In this process, the stirring speed ranges optionally from 500 rpm to 2500 rpm. After mixing and dispersing, the conductive filler and the organic carrier may be placed for a certain time, such as half an hour (which can enhance a wetting effect of the organic carrier on the conductive filler and improve a subsequent rolling effect), and then three-roll rolling is performed. Viscosity of the conductive paste finally obtained may range from 10 Pa·s to 40 Pa·s.

The materials in the conductive paste are illustrated in detail below in embodiments of the present application.

Base Resin

The weight percentage of the epoxy resin in the base resin may be 50%, 55%, 60%, 65%, 70%, 75%, 80%, 85%, 90% or 95%. The more epoxy resin in the base resin, the better the soldering property of the conductive paste. The more polyurethane, the better the flexibility of the conductive paste. Those skilled in the art may make selection according to an actual requirement. Optionally, in an embodiment of the present application, a weight ratio of epoxy resin to polyurethane ranges from 1:1 to 2:1, so that the conductive paste has both good soldering resistance and flexibility.

Optionally, the epoxy resin has a softening point above 100° C., an epoxide equivalent higher than 5000, and a molecular weight higher than 10000. When the softening point of the epoxy resin is above 100° C. and/or the molecular weight of the epoxy resin is higher than 10000, the epoxy resin has better heat resistance, which enables the conducting circuit to withstand higher-temperature soldering processes, to be more widely used, and to be more convenient. When the epoxide equivalent of the epoxy resin is higher than 5000, the epoxy resin has fewer reactive groups, which is helpful to improve the flexibility of the conducting circuit.

Optionally, the polyurethane has an elongation rate higher than 200% and a Kofler melting point above 70° C., so that the polyurethane has better elasticity, better improves the flexibility of the conducting circuit, and has better temperature resistance.

Conductive Filler

In an embodiment of the present application, the conductive filler is one or a mixture of at least two of gold, silver, copper, iron, nickel, aluminum, graphene, carbon black, graphite, silver-coated copper powder, and the like. The conductive filler is in a shape of one or a combination of at least two of a flake, a ball, a line, a rod, a needle, a branch, and the like. The conductive filler has a dimension in a range from 0.1 μm to 6 μm.

For example, in an embodiment of the present application, the conductive filler is ball silver powder with a particle size in a range from 400 nm to 600 nm. According to conventional cognition of those skilled in the art, the larger the particle size of the conductive filler, the worse the conductivity, the smaller the particle size, the higher the activity, and the worse the soldering resistance. In conventional formulations of the related art, the conductive filler cannot be soldered when having a particle size ranging from 400 nm to 600 nm, but can be successfully soldered in the present application, and then the conductive paste in the present application can have both good conductivity and excellent soldering properties.

Solvent

In an embodiment of the present application, the solvent is optionally one or a mixture of at least two of ethanol, isopropanol, n-propanol, ethylene glycol, propylene glycol, glycerin, n-butyl alcohol, ethylene glycol monopropyl ether, ethylene glycol monobutyl ether, diethylene glycol monoethyl ether, diethylene glycol monopropyl ether, diethylene glycol monobutyl ether, propylene glycol monopropyl ether, propylene glycol monobutyl ether, dipropylene glycol monoethyl ether, dipropylene glycol monopropyl ether, dipropylene glycol monobutyl ether, ethylene glycol monopropyl ether acetate, ethylene glycol monobutyl ether acetate, diethylene glycol monoethyl ether acetate, diethylene glycol monopropyl ether acetate, diethylene glycol monobutyl ether acetate, propylene glycol monopropyl ether acetate, propylene glycol monobutyl ether acetate, dipropylene glycol monoethyl ether acetate, dipropylene glycol monopropyl ether acetate, dipropylene glycol monobutyl ether acetate, isophorone, and terpineol.

Curing Agent

In an embodiment of the present application, the curing agent may be an isocyanate curing agent, an anhydride curing agent, a dicyanamide or polycyanamide curing agent, an imidazole curing agent, a polyether sulfone curing agent, or the like.

Specifically, the blocked polyisocyanate is optionally one or a mixture of at least two of blocked toluene diisocyanate, blocked hexamethylene diisocyanate, blocked diphenylmethane diisocyanate, blocked isophorone diisocyanate, blocked xylylene diisocynate, and blocked polyphenylmethane polyisocyanate.

Auxiliary Agent

In an embodiment of the present application, the auxiliary agent may include one or two of a defoaming agent, an adhesion promoter, a wetting dispersant, a base material wetting agent, a coupling agent, a leveling agent, an antioxidant, and the like. The defoaming agent may be one or a mixture of at least two of a polysiloxane defoaming agent, an organic silicon defoaming agent, and a polyether defoaming agent. The adhesion promoter may be a silane coupling agent adhesion promoter.

Optionally, the conductive paste in the embodiment of the present application further includes a low-molecular weight polyol. The low-molecular weight polyol may further react with polyurethane to improve the flexibility of the conducting circuit. On this basis, the curing agent is further optionally blocked polyisocyanate, so that the polyurethane, the low-molecular weight polyol, and the blocked polyisocyanate react during heat curing to form a flexible three-dimensional net structure, and do not react during the preparation, storage, printing molding, which may not cause adverse effects. The low-molecular weight polyol refers to a polyol with a molecular weight less than 600.

It is to be noted that, during the heat curing of the conductive paste, the reaction among the polyurethane, the low-molecular weight polyol, and the blocked polyisocyanate may include the following situations. For example, active groups of the polyurethane and active groups of the low-molecular weight polyol react with active groups of the blocked polyisocyanate, or active groups of the low-molecular weight polyol and active groups of the blocked polyisocyanate react with active groups of the polyurethane, or active groups of the polyurethane and active groups of the blocked polyisocyanate react with active groups of the low-molecular weight polyol, or active groups of the polyurethane, active groups of the low-molecular weight polyol, and active groups of the blocked polyisocyanate react with one another. In the above situations, after the reaction among the polyurethane, the low-molecular weight polyol, and the blocked polyisocyanate, a flexible three-dimensional net structure may be formed.

Optionally, the low-molecular weight polyol selected in the embodiment of the present application is one or two of polyethylene glycol and polypropylene glycol, preferably polyethylene glycol that is liquid or viscous at room temperature, which can be easily mixed with other materials without additional dissolution during the preparation of the conductive paste and can participate in the reaction during subsequent heat curing.

Optionally, the conductive paste in the embodiment of the present application includes: 3 wt % to 15 wt % of the base resin, 5 wt % to 20 wt % of the solvent, 60 wt % to 85 wt % of the conductive filler, 3 wt % to 15 wt % of the low-molecular weight polyol, 3 wt % to 10 wt % of the blocked polyisocyanate, and 0.2 wt % to 10 wt % of the auxiliary agent.

For example, in the conductive paste in the embodiment of the present application, the weight percentage of the base resin is 4%, 5%, 6%, 7%, 8%, 9%, 10%, 11%, 12%, 13% or 14%; the weight percentage of the solvent is 6%, 7%, 8%, 9%, 10%, 11%, 12%, 13%, 14%, 15%, 16%, 17%, 18% or 19%; the weight percentage of the conductive filler is 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83% or 84%; the weight percentage of the low-molecular weight polyol is 4%, 5%, 6%, 7%, 8%, 9%, 10%, 11%, 12%, 13% or 14%; the weight percentage of the blocked polyisocyanate is 4%, 5%, 6%, 7%, 8% or 9%; and the weight percentage of the auxiliary agent is 0.5%, 1%, 2%, 3%, 4%, 5%, 6%, 7%, 8%, 9% or 10%.

In addition, according to an embodiment of the present application, an electronic device is provided. Specifically, as shown in FIG. 1, FIG. 1 is a schematic structural diagram of an electronic device according to an embodiment of the present application. The electronic device includes a substrate 1 and a conducting circuit 2 located on the substrate 1. The conducting circuit 2 is formed by printing and heat curing of the conductive paste according to any one of the foregoing.

For example, the conductive paste is printed on the substrate by screen printing, and then placed in a blast drying oven to be heated, sintered, and cured. The conductive paste is heated and sintered at a temperature in a range from 120° C. to 200° C., and sintered for 10 min to 80 min.

The conducting circuit in the embodiment of the present application has good soldering properties, flexibility, and electrical properties, and even can have good flexibility under a high film thickness (such as above 30 µm). After testing, the conducting circuit has a resistance change rate lower than 40% when bending 10000 times. Sheet resistance of the flexible conducting circuit ranges from 5 mΩ/sq/mil to 12 mΩ/sq/mil.

The conducting circuit may have a thickness in a range from 10 µm to 60 µm, such as 20 µm, 30 µm, 40 µm, or 50 µm.

The substrate may be a flexible substrate or a rigid substrate. The flexible substrate may be one of polyethylene terephthalate (PET), polybutylene terephthalate (PBT), polyethylene naphthalate (PEN), polyimide (PI), and polyamide (PA) films.

Optionally, as shown in FIG. 1, the electronic device further includes an electronic component 4 soldered to the conducting circuit by solder paste 3. According to an actual requirement, the electronic component may be a switch, a power source, a light-emitting device, a sensor, a chip, or the like, which is not limited in the embodiment of the present application.

Advantages of the conductive paste are described below in the embodiments of the present application through specific embodiments and comparative examples.

Embodiment 1

The conductive paste includes the following components: 3 wt % of epoxy resin, 3 wt % of polyurethane, 14 wt % of diethylene glycol monoethyl ether acetate, 70 wt % of ball silver powder, 3.5 wt % of polyethylene glycol, 5 wt % of hexamethylene diisocyanate, 0.5 wt % of defoaming agent, and 1 wt % of adhesion promoter.

A conductive paste preparation method includes:
heating, stirring, and dissolving epoxy resin, polyurethane, diethylene glycol monoethyl ether acetate, polyethylene glycol, hexamethylene diisocyanate, a defoaming agent, and an adhesion promoter to obtain an organic carrier; and
stirring and dispersing ball silver powder and the organic carrier, then placing the mixture for half an hour, and performing three-roll rolling, to finally obtain a conductive paste.

The conductive paste is printed on a PI film flexible substrate by a screen printer, and placed in a blast drying oven to be sintered and cured, to obtain a conducting circuit.

Figure 2:
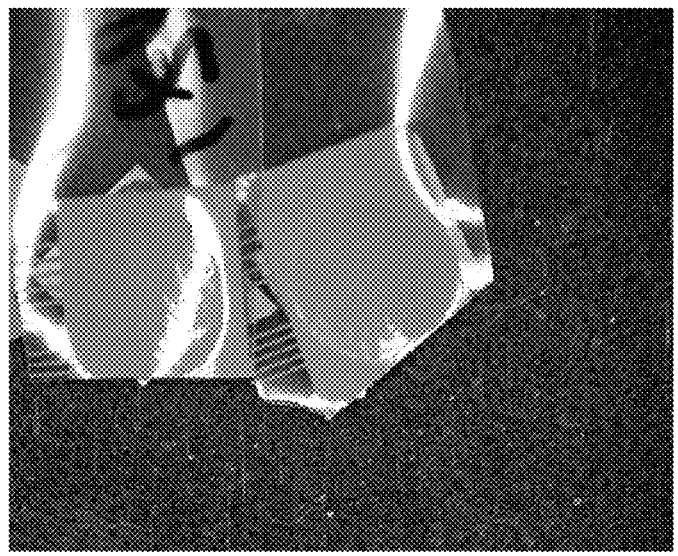
FIG. 2 is a diagram of a soldering effect of Embodiment 1 according to an embodiment of the present application.

Manual heating surface mount technology (SMT) simulation soldering tests and bending tests are performed on the conducting circuit by using lead-free solder paste. See FIG. 2 for the soldering effect after soldering.

Embodiment 2

The conductive paste includes the following components: 7 wt % of epoxy resin, 3 wt % of polyurethane, 14 wt % of diethylene glycol monoethyl ether acetate, 55 wt % of ball silver powder, 15 wt % of flake silver powder, 4 wt % of hexamethylene diisocyanate, 1 wt % of defoaming agent, and 1 wt % of adhesion promoter.

A conductive paste preparation method includes:
heating, stirring, and dissolving epoxy resin, polyurethane, diethylene glycol monoethyl ether acetate, hexamethylene diisocyanate, a defoaming agent, and an adhesion promoter to obtain an organic carrier; and
stirring and dispersing ball silver powder, flake silver powder, and the organic carrier, then placing the mixture for half an hour, and performing three-roll rolling, to finally obtain a conductive paste.

The conductive paste is printed on a PI film flexible substrate by a screen printer, and placed in a blast drying oven to be sintered and cured, to obtain a conducting circuit.

Manual heating SMT simulation soldering tests and bending tests are performed on the conducting circuit by using lead-free solder paste. The soldering effect after soldering is the same as that in FIG. 2.

Embodiment 3

The conductive paste includes the following components: 4 wt % of epoxy resin, 2 wt % of polyurethane, 14 wt % of diethylene glycol monoethyl ether acetate, 70 wt % of flake silver powder, 4 wt % of polyethylene glycol, 4 wt % of hexamethylene diisocyanate, 1 wt % of defoaming agent, and 1 wt % of adhesion promoter.

A conductive paste preparation method includes:
heating, stirring, and dissolving epoxy resin, polyurethane, diethylene glycol monoethyl ether acetate, polyethylene glycol, hexamethylene diisocyanate, a defoaming agent, and an adhesion promoter to obtain an organic carrier; and
stirring and dispersing flake silver powder and the organic carrier, then placing the mixture for half an hour, and performing three-roll rolling, to finally obtain a conductive paste.

The conductive paste is printed on a PI film flexible substrate by a screen printer, and placed in a blast drying oven to be sintered and cured, to obtain a conducting circuit.

Manual heating SMT simulation soldering tests and bending tests are performed on the conducting circuit by using lead-free solder paste. The soldering effect after soldering is the same as that in FIG. 2.

Embodiment 4

The conductive paste includes the following components: 5 wt % of epoxy resin, 5 wt % of polyurethane, 13 wt % of diethylene glycol monoethyl ether acetate, 60 wt % of ball silver powder, 10 wt % of silver-coated copper powder, 5 wt % of hexamethylene diisocyanate, 1 wt % of defoaming agent, and 1 wt % of adhesion promoter.

A conductive paste preparation method includes:
heating, stirring, and dissolving epoxy resin, polyurethane, diethylene glycol monoethyl ether acetate, hexamethylene diisocyanate, a defoaming agent, and an adhesion promoter to obtain an organic carrier; and
stirring and dispersing ball silver powder, silver-coated copper powder, and the organic carrier, then placing the mixture for half an hour, and performing three-roll rolling, to finally obtain a conductive paste.

The conductive paste is printed on a PET film flexible substrate by a screen printer, and placed in a blast drying oven to be sintered and cured, to obtain a conducting circuit.

Manual heating SMT simulation soldering tests and bending tests are performed on the conducting circuit by using lead-free solder paste. The soldering effect after soldering is the same as that in FIG. 2.

Comparative Example 1

The conductive paste includes the following components: 7 wt % of polyurethane, 15 wt % of diethylene glycol monoethyl ether acetate, 60 wt % of ball silver powder, 10 wt % of silver-coated copper powder, 2 wt % of polyethylene glycol, 4 wt % of hexamethylene diisocyanate, 0.5 wt % of defoaming agent, and 1.5 wt % of adhesion promoter.

A conductive paste preparation method includes:
heating, stirring, and dissolving polyurethane, diethylene glycol monoethyl ether acetate, polyethylene glycol, hexamethylene diisocyanate, a defoaming agent, and an adhesion promoter to obtain an organic carrier; and
stirring and dispersing ball silver powder, silver-coated copper powder, and the organic carrier, then placing the mixture for half an hour, and performing three-roll rolling, to finally obtain a conductive paste.

The conductive paste is printed on a PI flexible substrate by a screen printer, and placed in a blast drying oven to be sintered and cured, to obtain a conducting circuit.

Figure 3:
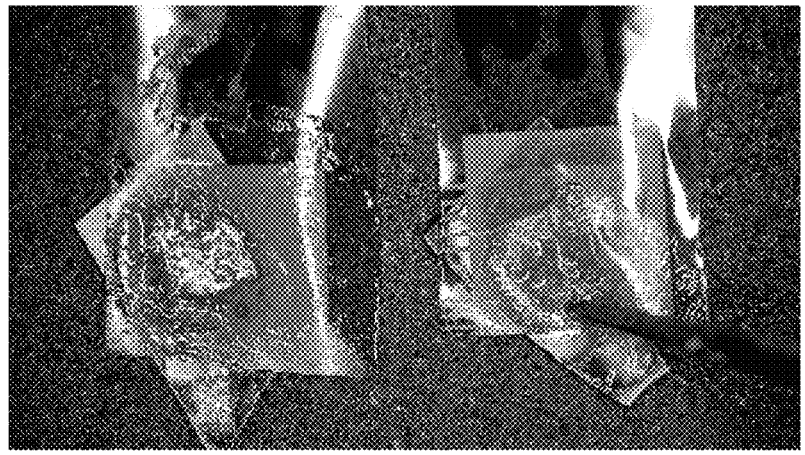
FIG. 3 is a diagram of a soldering effect of Comparative Example 1 according to an embodiment of the present application.

Manual heating SMT simulation soldering tests and bending tests are performed on the conducting circuit by using lead-free solder paste. See FIG. 3 for the soldering effect after soldering.

Comparative Example 2

The conductive paste includes the following components: 7 wt % of epoxy resin, 13 wt % of diethylene glycol monoethyl ether acetate, 72 wt % of flake silver powder, 2 wt % of polyethylene glycol, 4 wt % of hexamethylene diisocyanate, 1 wt % of defoaming agent, and 1 wt % of adhesion promoter.

A conductive paste preparation method includes:
heating, stirring, and dissolving epoxy resin, polyester resin, diethylene glycol monoethyl ether acetate, polyethylene glycol, hexamethylene diisocyanate, a defoaming agent, and an adhesion promoter in an oil bath at 80° C. to obtain an organic carrier; and
stirring and dispersing flake silver powder and the organic carrier at 2000 rpm in a mixing tank, then placing the mixture for half an hour, and performing three-roll rolling, to finally obtain a conductive paste with a viscosity in a range from 20 Pa·s to 30 Pa·s.

The conductive paste is printed on a PI flexible substrate by a screen printer, and placed in a blast drying oven to be heated at 200° C., sintered, and cured, to obtain a conducting circuit.

Manual heating SMT simulation soldering tests and bending tests are performed on the conducting circuit by using lead-free solder paste.

Comparative Example 3

The conductive paste includes the following components: 1 wt % of epoxy resin, 4 wt % of polyurethane, 1 wt % of polyimide resin, 13 wt % of diethylene glycol monoethyl ether acetate, 74 wt % of flake silver powder, 1 wt % of polyethylene glycol, 4 wt % of hexamethylene diisocyanate, 1 wt % of defoaming agent, and 1 wt % of adhesion promoter.

A conductive paste preparation method includes:
heating, stirring, and dissolving epoxy resin, polyurethane, diethylene glycol monoethyl ether acetate, polyethylene glycol, hexamethylene diisocyanate, a defoaming agent, and an adhesion promoter in an oil bath at 80° C. to obtain an organic carrier; and
stirring and dispersing flake silver powder and the organic carrier at 2000 rpm in a mixing tank, then placing the mixture for half an hour, and performing three-roll rolling, to finally obtain a conductive paste with a viscosity in a range from 20 Pa·s to 30 Pa·s.

The conductive paste is printed on a PI flexible substrate by a screen printer, and placed in a blast drying oven to be heated at 200° C., sintered, and cured, to obtain a conducting circuit.

Figure 4:
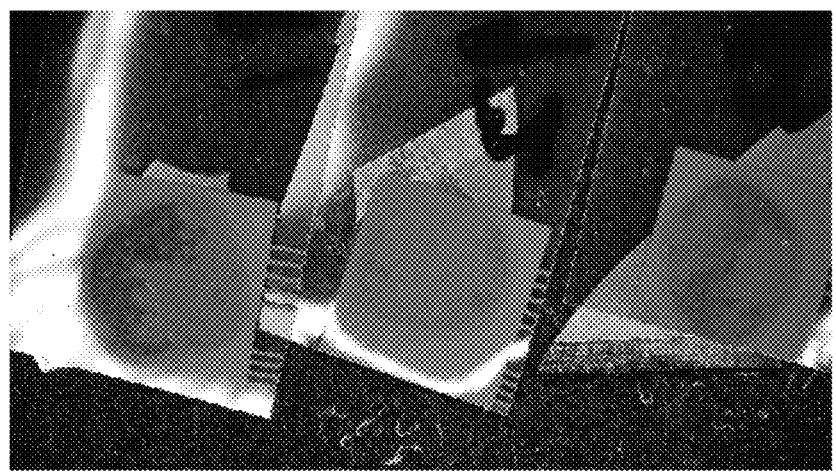
FIG. 4 is a diagram of a soldering effect of Comparative Example 3 according to an embodiment of the present application.

Manual heating SMT simulation soldering tests and bending tests are performed on the conducting circuit by using lead-free solder paste. See FIG. 4 for the soldering effect after soldering.

A bending test method involves pressing the conducting circuit for 1 minute by using a weight of 2 kg after the conducting circuit is folded in half at 180°, which is denoted as one fold.

Property Comparison

| Sample | Soldering Resistance | Flexibility |
|---|---|---|
| Embodiment 1 | Solderability and good adhesion | Do not fail in the case of 20 folds |
| Embodiment 2 | Solderability and good adhesion | Do not fail in the case of 20 folds |
| Embodiment 3 | Solderability and good adhesion | Do not fail in the case of 20 folds |
| Embodiment 4 | Solderability and good adhesion | Do not fail in the case of 20 folds |
| Comparative Example 1 | Non-solderability, serious tin immersion, and peeling off of conductive layer | Do not fail in the case of 20 folds |
| Comparative Example 2 | Solderability and good adhesion | Fail in the case of 7 folds |
| Comparative Example 3 | Poor solderability, mild tin immersion, and peeling off of conductive layer | Do not fail in the case of 20 folds |

Finally, it should be noted that the above embodiments are merely intended to describe instead of limiting the technical solutions of the present application. Although the present application is described in detail with reference to the above embodiments, those of ordinary skill in the art should understand that they can still make modifications to the technical solutions described in the above embodiments, or make equivalent replacements to some or all of the technical features in the technical solutions. These modifications or replacements do not make the essence of corresponding technical solutions depart from the scope of the technical solutions of the embodiments of the present application.

What is claimed is:

1. A conductive paste, comprising: a base resin, a solvent, a conductive filler, a curing agent, and an auxiliary agent,
wherein the base resin is a mixture of epoxy resin and polyurethane, a weight percentage of the epoxy resin in the base resin is greater than or equal to 50%, and the epoxy resin limits the polyurethane in a structure formed by curing of the base resin
wherein the conductive paste further comprises a low-molecular weight polyol,
wherein the curing agent is blocked polyisocyanate, and the polyurethane, the low-molecular weight polyol, and the blocked polyisocyanate are reacted during a heat curing process to form a flexible three-dimensional net structure; and
wherein the conductive paste comprises 3 wt % to 15 wt % of the base resin, 5 wt % to 20 wt % of the solvent, 60 wt % to 85 wt % of the conductive filler, 3 wt % to 15 wt % of the low-molecular weight polyol, 3 wt % to 10 wt % of the blocked polyisocyanate, and 0.2 wt % to 10 wt % of the auxiliary agent.

2. The conductive paste according to claim 1, wherein the epoxy resin has a softening point above 100° C., an epoxide equivalent higher than 5000 g/eq, and a molecular weight higher than 10000 g/mol.

3. The conductive paste according to claim 1, wherein the polyurethane has an elongation rate higher than 200% and a Kofler melting point above 70° C.

4. The conductive paste according to claim 1, wherein the conductive filler is ball silver powder with a particle size ranging from 400 nm to 600 nm.

5. The conductive paste according to claim 1, wherein the low-molecular weight polyol is at least one of polyethylene glycol or polypropylene glycol.

6. The conductive paste according to claim 1, wherein the blocked polyisocyanate is one selected from a group consisting of blocked toluene diisocyanate, blocked hexamethylene diisocyanate, blocked diphenylmethane diisocyanate, blocked isophorone diisocyanate, blocked xylylene diisocynate, and blocked polyphenylmethane polyisocyanate, or a mixture of at least two selected from the group.

7. An electronic device, comprising a substrate and a conducting circuit located on the substrate, wherein the conducting circuit is formed by printing and heat curing of the conductive paste according to claim 1.

8. The electronic device according to claim 7, further comprising an electronic component soldered to the conducting circuit by solder paste.

\* \* \* \* \*